(12) United States Patent
Tsunoda et al.

(10) Patent No.: US 10,575,444 B2
(45) Date of Patent: Feb. 25, 2020

(54) ELECTRONIC APPARATUS

(71) Applicant: FUJITSU LIMITED, Kawasaki-shi, Kanagawa (JP)

(72) Inventors: Yosuke Tsunoda, Tachikawa (JP); Jie Wei, Hachioji (JP); Masumi Suzuki, Kawasaki (JP); Michimasa Aoki, Kawasaki (JP); Keizou Takemura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/960,609

(22) Filed: Apr. 24, 2018

(65) Prior Publication Data

US 2018/0317345 A1 Nov. 1, 2018

(30) Foreign Application Priority Data

Apr. 27, 2017 (JP) ................................. 2017-088972

(51) Int. Cl.
| | |
|---|---|
| G06F 1/16 | (2006.01) |
| H05K 5/00 | (2006.01) |
| H05K 7/00 | (2006.01) |
| H05K 7/20 | (2006.01) |
| G06F 1/20 | (2006.01) |
| H01L 23/467 | (2006.01) |
| G06F 1/18 | (2006.01) |
| H01L 23/427 | (2006.01) |

(52) U.S. Cl.
CPC ......... *H05K 7/20436* (2013.01); *G06F 1/181* (2013.01); *G06F 1/20* (2013.01); *H01L 23/467* (2013.01); *H05K 7/20127* (2013.01); *H05K 7/20336* (2013.01); *G06F 2200/201* (2013.01); *H01L 23/427* (2013.01); *H05K 7/20809* (2013.01)

(58) Field of Classification Search
CPC .......... H05K 7/20436; H05K 7/20127; H05K 7/20336; G06F 1/20; G06F 1/203; G06F 1/206
USPC ................................ 361/690, 679.48–679.51
See application file for complete search history.

(56) References Cited

U.S. PATENT DOCUMENTS

| 5,339,214 A | * | 8/1994 | Nelson | G06F 1/20 165/104.33 |
| 6,297,958 B1 | * | 10/2001 | Lutz, Jr. | H05K 7/20009 174/522 |
| 7,280,358 B2 | * | 10/2007 | Malone | G06F 1/20 165/104.33 |
| 8,472,181 B2 | * | 6/2013 | Doll | G06F 1/20 361/679.49 |

(Continued)

FOREIGN PATENT DOCUMENTS

| JP | 2001-217366 | 8/2001 |
| JP | 2003-078091 | 3/2003 |

*Primary Examiner* — Anthony M Haughton
(74) *Attorney, Agent, or Firm* — Fujitsu Patent Center

(57) ABSTRACT

An electronic apparatus includes a housing, a heating component arranged inside the housing, a plurality of heat sinks arranged inside the housing, a heat transport member coupled such that heat is transferred from the heating component to the heat sinks, air intake regions positioned in the housing, corresponding to the respective heat sinks, and arranged below and close to the respective heat sinks, and an air exhaust region positioned in the housing and arranged above the heat sinks.

11 Claims, 11 Drawing Sheets

(56) References Cited

U.S. PATENT DOCUMENTS

| | | | |
|---|---|---|---|
| 2006/0002084 A1* | 1/2006 | Wei | H05K 7/20745 |
| | | | 361/695 |
| 2013/0083253 A1* | 4/2013 | Maeshima | H04N 5/64 |
| | | | 348/739 |
| 2014/0036440 A1* | 2/2014 | Inoue | H01L 23/467 |
| | | | 361/692 |

* cited by examiner

ELECTRONIC APPARATUS

CROSS-REFERENCE TO RELATED APPLICATION

This application is based upon and claims the benefit of priority of the prior Japanese Patent Application No. 2017-88972, filed on Apr. 27, 2017, the entire contents of which are incorporated herein by reference.

FIELD

The embodiments discussed herein are related to electronic apparatuses.

BACKGROUND

One example of a cooling device including two heat pipes having first end portions connected to different locations of a heat receiving portion in contact with a heating component on a circuit board and second end portions connected to respective finned structures outside the circuit board. This cooling device includes a fan for ejecting air into the finned structures along the air intake surfaces of the finned structures, and the fan is disposed in a gap between the finned structures.

One example of a heat-pipe cooling device in which an intermediate portion of a heat pipe having a substantially U shape or substantially V shape is fixed to a heat receiving member and opposite end portions of the heat pipe are connected to a plurality of radiating plates arranged in parallel with each other. In another example of this heat-pipe cooling device, the opposite end portions of the heat pipe are connected to separate radiating plates.

When airflow for cooling the heating component inside the housing is obtained without using the fan, it is desired to increase the efficiency of cooling the heating component.

The followings are reference documents.
[Document 1] Japanese Laid-open Patent Publication No. 2001-217366, and
[Document 2] Japanese Laid-open Patent Publication No. 2003-78091.

SUMMARY

According to an aspect of the invention, an electronic apparatus includes a housing, a heating component arranged inside the housing, a plurality of heat sinks arranged inside the housing, a heat transport member coupled such that heat is transferred from the heating component to the heat sinks, air intake regions positioned in the housing, corresponding to the respective heat sinks, and arranged below and close to the respective heat sinks, and an air exhaust region positioned in the housing and arranged above the heat sinks.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An electronic apparatus according to a first embodiment is described in detail below with reference to the drawings.

Figure 1:
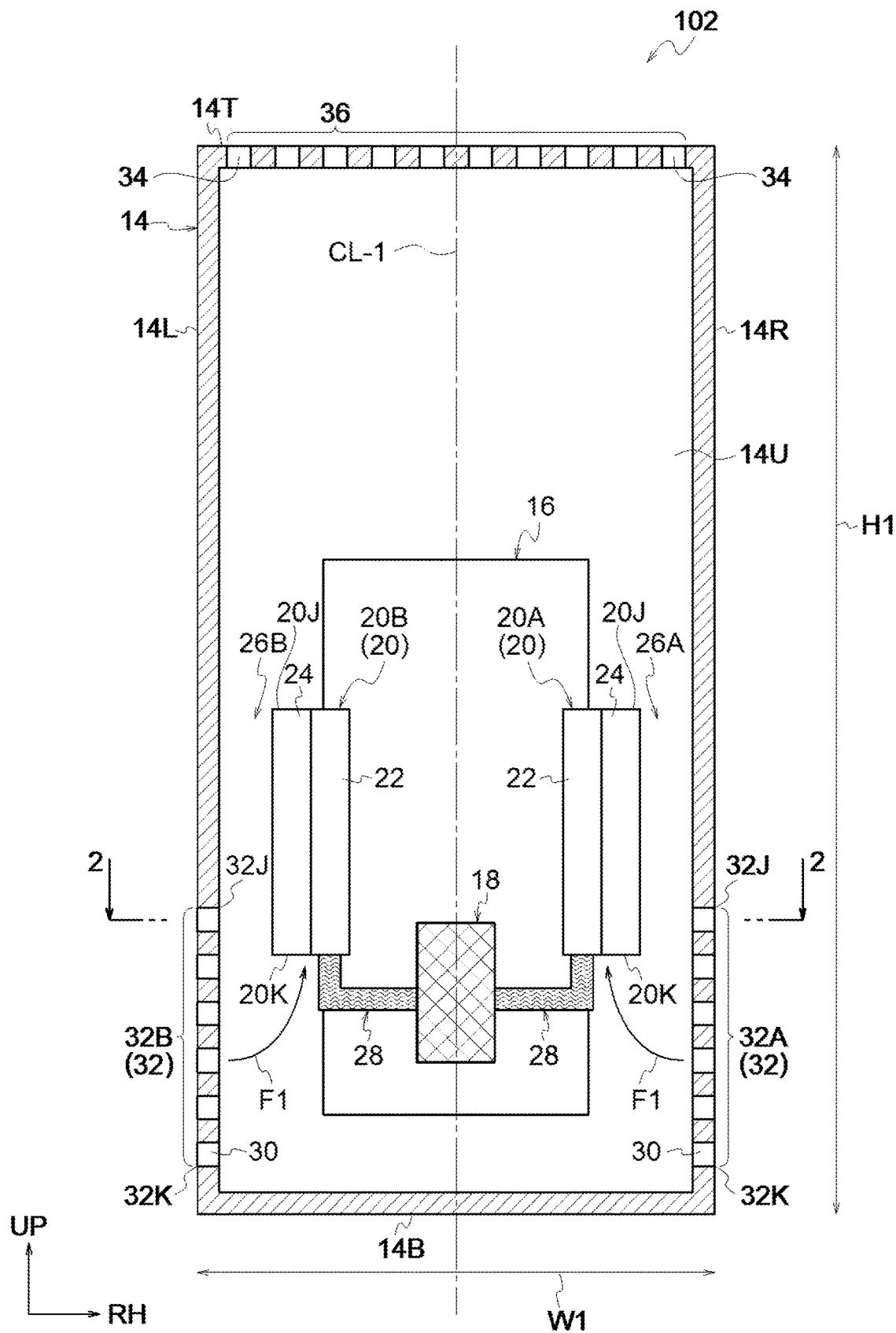
FIG. 1 is a longitudinal sectional view that illustrates an electronic apparatus according to a first embodiment.
Figure 2:
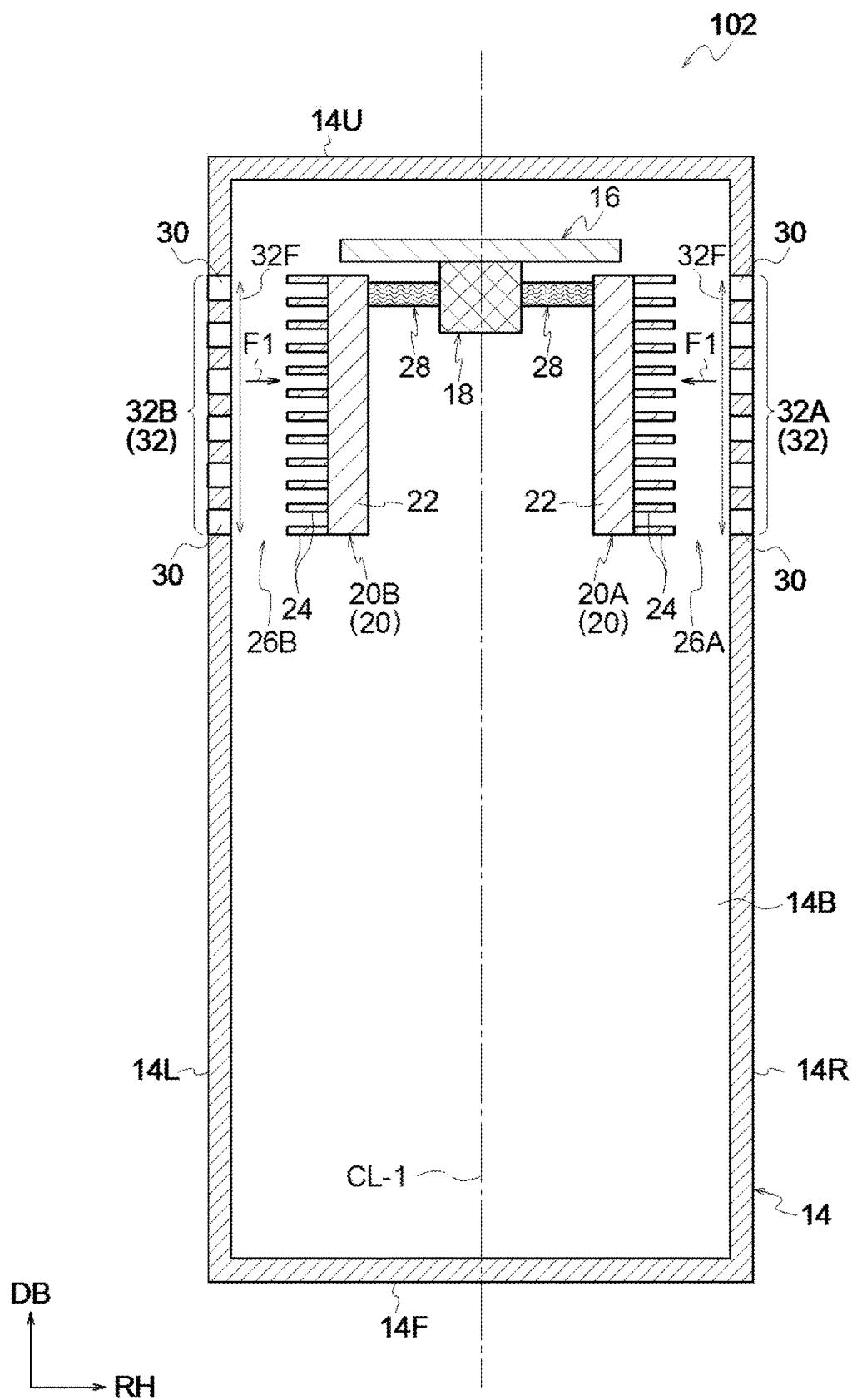
FIG. 2 is a cross-sectional view taken along the line II-II in FIG. 1 and illustrating the electronic apparatus according to the first embodiment.

As illustrated in FIGS. 1 and 2, an electronic apparatus 102 according to the first embodiment includes a housing 14. The housing 14 is a box member having a rectangular parallelepiped shape and has a right surface 14R, left surface 14L, back surface 14U, front surface 14F, top surface 14T, and bottom surface 14B. In the drawings, the right-hand side in the width direction, deep side in the depth direction, and upper side in the vertical direction of the housing 14 are indicated by the arrows RH, DB, and UP, respectively. In FIGS. 1 and 2, the center of the housing 14 in the width direction is indicated by a center line CL-1. The center line CL-1 represents a face in the center of the gap between the right surface 14R and left surface 14L and in parallel with the right surface 14R and left surface 14L. In the first embodiment, the electronic apparatus is the one in which the height H1 is longer than the width W1 of the housing 14 and the housing 14 is vertically oriented.

A substrate 16 is arranged inside the housing 14. In the present embodiment, the substrate 16 has a rectangular planar shape and is oriented such that the orientation of its longer side coincides with the vertical direction and the orientation of its shorter side coincides with the width direction and such that it is parallel with the back surface 14U and is on a deeper side. One example of the substrate 16 may be attached to the housing 14 with a fastener, such as a bolt or clip.

A heating component 18 is mounted on the substrate 16. One example of the heating component 18 may be an electronic component, such as an integrated circuit, and produces heat during operation. In the first embodiment, the heating component 18 is mounted in a location that is central in the width direction (direction of the shorter side) and that is in a lower portion in the vertical direction (direction of the longer side) of the substrate 16. The location in which the heating component 18 is mounted on the substrate 16 is not limited to specific ones.

A plurality of heat sinks 20 are arranged inside the housing 14. In the first embodiment, two heat sinks 20 are spaced apart from each other in the width direction and are distinguished as heat sinks 20A and 20B as appropriate. The heat sinks 20A and 20B are symmetrical in location and shape with respect to the center line CL-1.

Each of the heat sinks 20 includes a rectangular planar base plate 22 and a plurality of fins 24 extending from the base plate 22. The base plate 22 is arranged in parallel with the right surface 14R and left surface 14L of the housing 14.

The plurality of fins 24 in each of the heat sinks 20 are planar, spaced apart from each other at regular intervals, and arranged in parallel with each other. Each of the fins 24 is oriented such that it extends along the vertical direction. The fins 24 in each of the heat sinks 20 extend from the base plate 22 toward the corresponding right surface 14R or left surface 14L, that is, outward in the width direction (direction of the arrow RH and its opposite direction).

The heat sink 20A and right surface 14R are not in contact with each other, and a gap 26A is present between the heat sink 20A and right surface 14R. Similarly, the heat sink 20B and left surface 14L are not in contact with each other, and a gap 26B is present between the heat sink 20B and left surface 14L.

In the first embodiment, neither of the plurality of heat sinks 20 is in contact with the heating component 18. Each of the plurality of heat sinks 20 is coupled to the heating component 18 with a heat transport member 28. The heat transport member 28 is a member for transporting heat from a higher temperature side to a lower temperature side. One example of the heat transport member 28 may be a heat pipe containing a heat transport medium (for example, water or oil). In the present embodiment, the heating component 18 corresponds to the higher temperature side, and the heat sink 20 corresponds to the lower temperature side. Accordingly, the heat is transported by the heat transport member 28 from the heating component 18 to the heat sink 20.

The housing 14 has one or more air inlets 30. In the first embodiment, the housing 14 has a plurality of air inlets 30 extending through the right surface 14R and left surface 14L. The inside and outside of the housing 14 communicate through the air inlets 30.

The plurality of air inlets 30 in each of the right surface 14R and left surface 14L are positioned in an air intake region 32, which is a predetermined region. In other words, the region where a predetermined number of air inlets 30 are gathered is the air intake region 32. Hereinafter, the air intake region in the right surface 14R is referred to as the air intake region 32A, and the air intake region in the left surface 14L is referred to as the air intake region 32B, as appropriate.

As illustrated in FIG. 2, the air intake regions 32 are disposed so as to correspond to the respective heat sinks 20. Specifically, the air intake region 32A corresponds to the heat sink 20A, and the air intake region 32B corresponds to the heat sink 20B.

Each of the air intake regions 32 is in a position opposed to the corresponding heat sink 20 when the housing 14 is seen in plan view. In the example illustrated in FIG. 2, when each of the air intake regions 32 is seen in the direction of the arrow A1, all of the air intake region 32 is an opposed region 32F which is opposed to the corresponding heat sink 20.

As described above, the air intake region 32 and the corresponding heat sink 20 are opposed to each other when the housing 14 is seen in plan view, and this arrangement achieves a structure in which the air intake region 32 is close to the corresponding heat sink 20. Because the air intake region 32 has the plurality of air inlets 30, the air inlets 30 are also arranged close to the corresponding heat sink 20.

As illustrated in FIG. 2, each of the air intake regions 32 and its corresponding heat sink 20 are on the same side with respect to the center line CL-1 when the housing 14 is seen in plan view. Specifically, the heat sink 20A and air intake region 32A are on the right-hand side in FIG. 2 with respect to the center line CL-1. The heat sink 20B and air intake region 32B are on the left-hand side in FIG. 2 with respect to the center line CL-1.

As described above, the air intake region 32 and the corresponding heat sink 20 are on the same side with respect to the center line CL-1, and this arrangement also achieves the structure in which the air intake region 32 is close to the corresponding heat sink 20.

A lower end portion (air intake lower end portion 32K) of the air intake region 32 is below a lower end portion (heat sink lower end portion 20K) of the corresponding heat sink 20. An upper end portion (air intake upper end portion 32J) of the air intake region 32 is in between an upper end portion (heat sink upper end portion 20J) of the corresponding heat sink 20 and the heat sink lower end portion 20K in the vertical direction.

As illustrated in FIG. 1, the housing 14 has one or more air outlets 34. In the first embodiment, the housing 14 has a plurality of air outlets 34 extending through the top surface 14T. That is, the air outlets 34 in the housing 14 are disposed above the heat sink 20.

In the example illustrated in FIG. 1, the air outlets 34 are positioned throughout the top surface 14T of the housing 14 in the width direction. The inside and outside of the housing 14 communicate through the air outlets 34. In the top surface 14T, the plurality of air outlets 34 are positioned in an air exhaust region 36, which is a predetermined region. In other words, the region where a predetermined number of air outlets 34 are gathered is the air exhaust region 36.

Next, the workings in the first embodiment are described.

When the heating component 18 works and produces heat, the heat from the heating component 18 is transported to the heat sinks 20 by the heat transport member 28. Because the number of heat sinks 20 is more than one, the heat from the heating component 18 is dispersed, and it may be more efficiently conveyed to the heat sinks 20 than that in a structure having a single heat sink 20. The temperature of air around the heat sinks 20 rises, buoyant force is produced, and the temperature of the air around the heat sinks 20 increases.

In the present embodiment, the air intake regions 32 having the air inlets 30 are arranged close to the corresponding heat sinks 20. That is, because the air close to the air inlets 30 tends to move upward, the air is easily led from the outside to the inside of the housing 14 and the quantity of airflow is larger than that in the structure in which the air inlets are in positions distant from the heat sinks 20. This may avoid the necessity for including, for example, a fan for sending air from the outside to the inside of the housing 14. As indicated by the arrows F1, the air led from the outside to the inside of the housing 14 moves upward while coming into contact with the heat sinks 20, and the heat is easily dissipated from the heat sinks 20 to the air. Thus, the efficiency of cooling the heating component 18 is also higher than that in the structure in which the air inlets are in positions distant from the heat sinks 20.

Moreover, because the air inlets 30 are arranged close to the corresponding heat sinks 20, the resistance of the air flowing in the channel from the air inlets 30 to the heat sinks 20 is lower than that in the structure in which the air inlets are in positions distant from the heat sinks 20. Thus, a decrease in the flow velocity of the air flowing through the air inlets 30 may be suppressed, and the volume of the air brought into contact with the heat sinks 20 per unit time may be increased.

The heat sinks 20 are not in contact with the right surface 14R or left surface 14L, in which the corresponding air intake region 32A or 32B is disposed, and the gaps 26A and 26B are present between the heat sink 20 and right surface 14R and between the heat sink 20 and the left surface 14L, respectively. The gaps 26A and 26B are narrower than other areas (for example, the gap between the right surface 14R and left surface 14L above the heat sinks 20) inside the housing 14, and the flow velocity of the influent air through the air inlets 30 increases. In this respect, the volume of the air brought into contact with the heat sinks 20 per unit time may also be increased.

As illustrated in FIG. 2, when the housing 14 is seen in plan view, the air intake region 32 is opposed to the corresponding heat sink 20. Accordingly, the air flowing into the housing 14 through the air intake region 32 may be brought into contact with the heat sinks 20 more directly than that in the structure in which the air intake region 32 is not opposed to the corresponding heat sink 20, and the cooling efficiency may be increased.

The air intake lower end portion 32K, which is the lower end portion of the air intake region 32, is below the heat sink lower end portion 20K of the corresponding heat sink 20. Because the air intake region 32 includes a portion positioned below the heat sink 20, the stream of gas flowing into the housing 14 through this portion is not blocked by the heat sink 20. Therefore, the stream of gas inside the housing 14 may be efficiently created.

The air intake upper end portion 32J, which is the upper end portion of the air intake region 32, is positioned between the heat sink upper end portion 20J of the corresponding heat sink 20 and the heat sink lower end portion 20K in the vertical direction. This arrangement may ensure that the air intake region 32 has the portion opposed to the heat sink 20 with reliability, and dissipation of heat from the heat sink 20 may be facilitated.

The air intake region 32 and the corresponding heat sink 20 are on the same side with respect to the center line CL-1. Thus, the air intake region 32 may be nearer the corresponding heat sink 20 than that in the structure in which the air intake region 32 and the corresponding heat sink 20 are on the opposite sides with respect to the center line CL-1. Because the air intake region 32 is near the heat sink 20, the air flowing into the housing 14 through the air intake region 32 may be brought into contact with the heat sink 20, and dissipation of heat from the heat sink 20 may be facilitated.

The air intake regions 32 are positioned in the right surface 14R and left surface 14L, which are side surfaces of the housing 14. Thus, the structure in which the air intake regions 32 are opposed to the heat sinks 20 may be easily achieved. If the air intake region 32 is positioned in the bottom surface 14B of the housing 14, the air inlets 30 may be obstructed by a surface on which the housing 14 is set (for example, top of a desk). Unlike this case, in the structure in which the air intake regions 32 are positioned in the side surfaces, the air inlets 30 are not obstructed by the surface for setting the housing 14.

In the present embodiment, the plurality of air intake regions 32 are positioned in the right surface 14R and left surface 14L, which are different side surfaces of the housing 14. Because the air inlets 30 in the plurality of air intake regions 32 are positioned in different side surfaces of the housing 14, the air intake regions 32 are dispersed, in comparison with the structure in which all the air intake regions 32 are positioned in the same side surface. Thus, the pressure loss occurring while gas passes through the air inlets 30 may be reduced, and a larger quantity of flow of intake air in each of the air intake regions 32 may be ensured.

Because the air outlets 34 are positioned above the heat sinks 20, the air inside the housing 14 is ejected to the outside of the housing 14 through the air outlets 34. The air exhaust region 36 with the air outlets 34 is positioned in the top surface 14T, and the top surface 14T faces the stream of the gas moving upward inside the housing 14 (upward direction). That is, because the surface facing the gas stream has the air exhaust region 36, the air may be ejected to the outside of the housing 14 more efficiently than that in the structure in which the air exhaust region 36 is positioned in the right surface 14R or left surface 14L of the housing 14.

In the present embodiment, neither of the heat sinks 20 is in direct contact with (neither is in contact with) the heating component 18, and the heat sinks 20 are connected to the heating component 18 with the heat transport members 28 and heat is transferred. In this structure, an imbalance in the amount of heat moved from the heating component 18 to each of the plurality of heat sinks 20 may be reduced, in comparison with the structure in which part of the plurality of heat sinks 20 is in direct contact with the heating component 18.

Next, a second embodiment is described. In the second embodiment, substantially the same elements, members, and the like as in the first embodiment are denoted by the same reference numerals and are not described.

Figure 3:
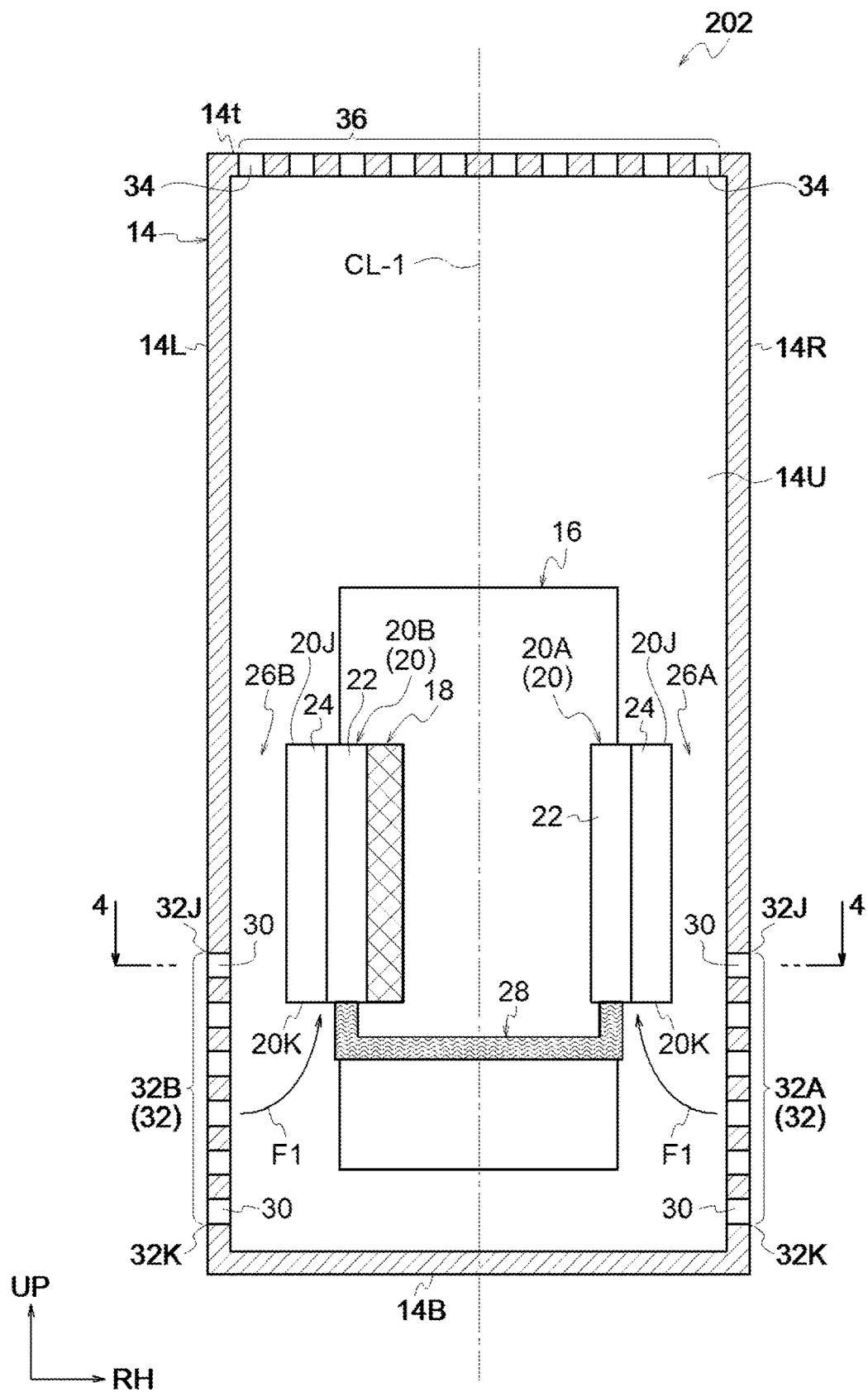
FIG. 3 is a longitudinal sectional view that illustrates an electronic apparatus according to a second embodiment.
Figure 4:
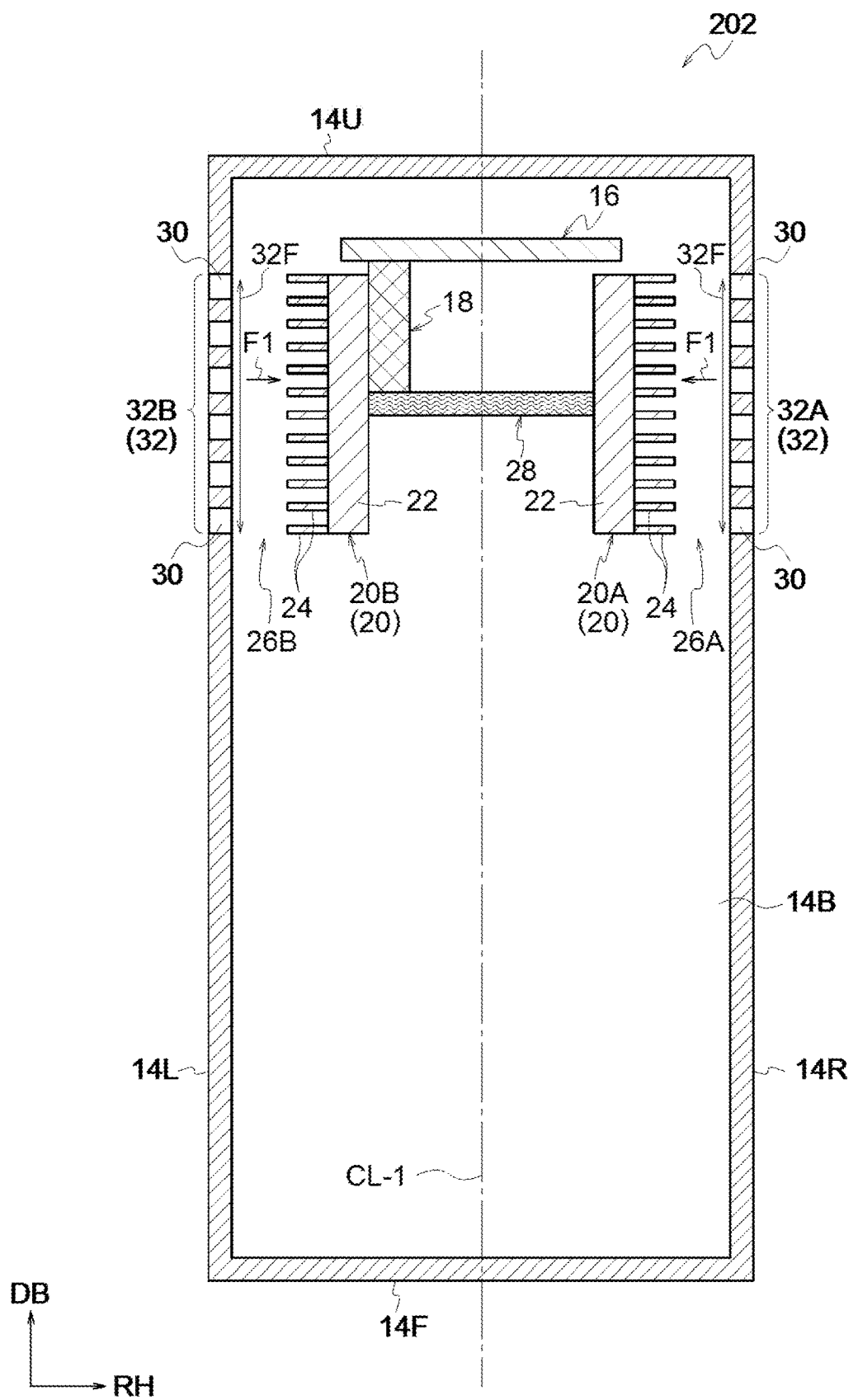
FIG. 4 is a cross-sectional view taken along the line IV-IV in FIG. 3 and illustrating the electronic apparatus according to the second embodiment.

As illustrated in FIGS. 3 and 4, an electronic apparatus 202 according to the second embodiment includes the heating component 18 mounted on the substrate 16 in a position leaning to one of the side surfaces (left surface 14L in the illustrated example). The heating component 18 is in direct contact with the heat sink 20B, which is illustrated on the left-hand side in the drawings.

Accordingly, the electronic apparatus 202 in the second embodiment may transfer a larger amount of heat of the heating component 18 to one of the heat sinks 20. By dissipating heat from the one heat sink 20, that is, the heat sink 20 to which the larger amount of heat has been transferred, the heating component 18 may be cooled. Moreover, because the heat is transferred by the heat transport member 28 from the one heat sink 20 to the other heat sink 20, the heat may also be dissipated from the other heat sink 20.

Next, a third embodiment is described. In the third embodiment, substantially the same elements, members, and the like as in the first or second embodiment are denoted by the same reference numerals and are not described.

Figure 5:
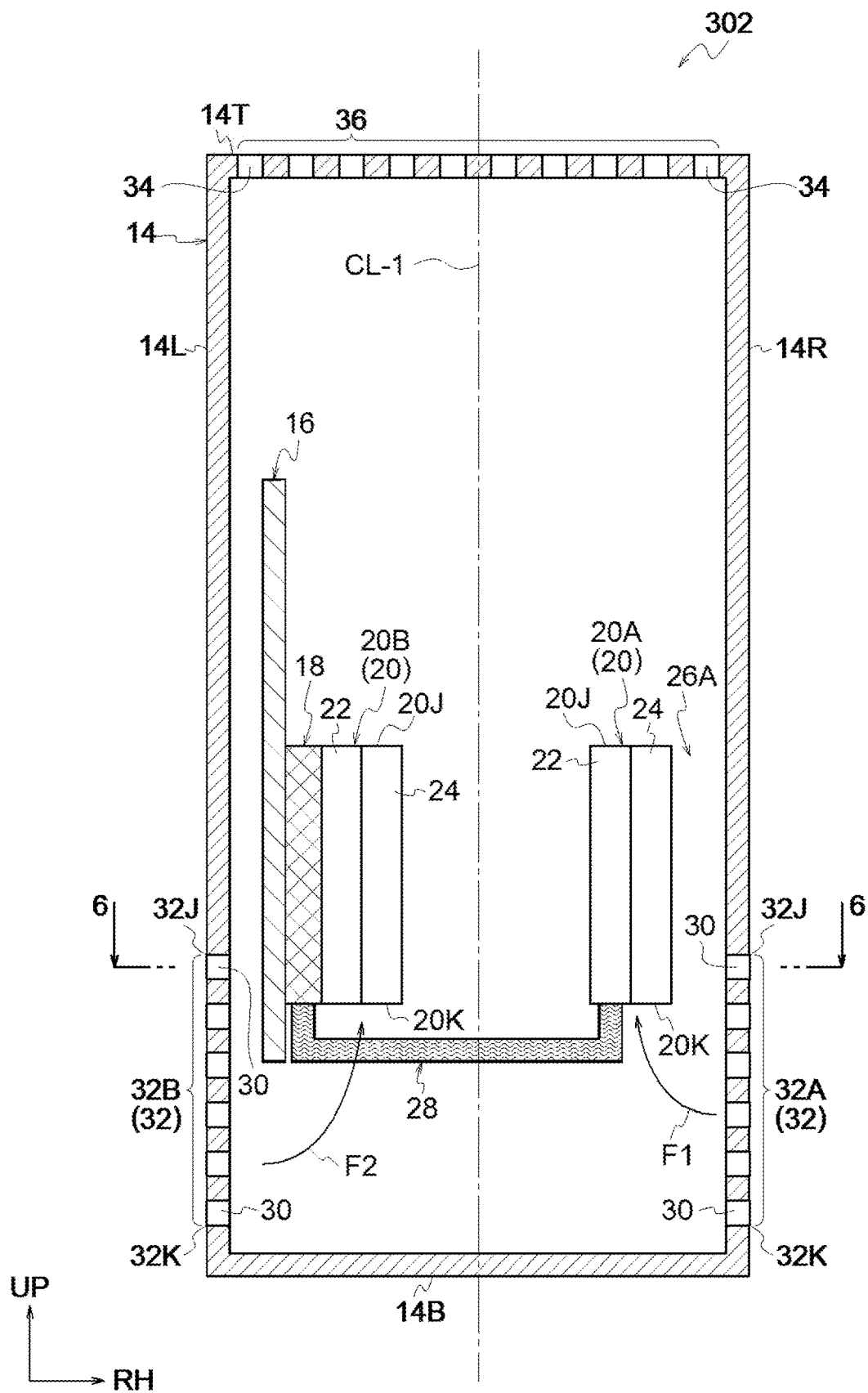
FIG. 5 is a longitudinal sectional view that illustrates an electronic apparatus according to a third embodiment.
Figure 6:
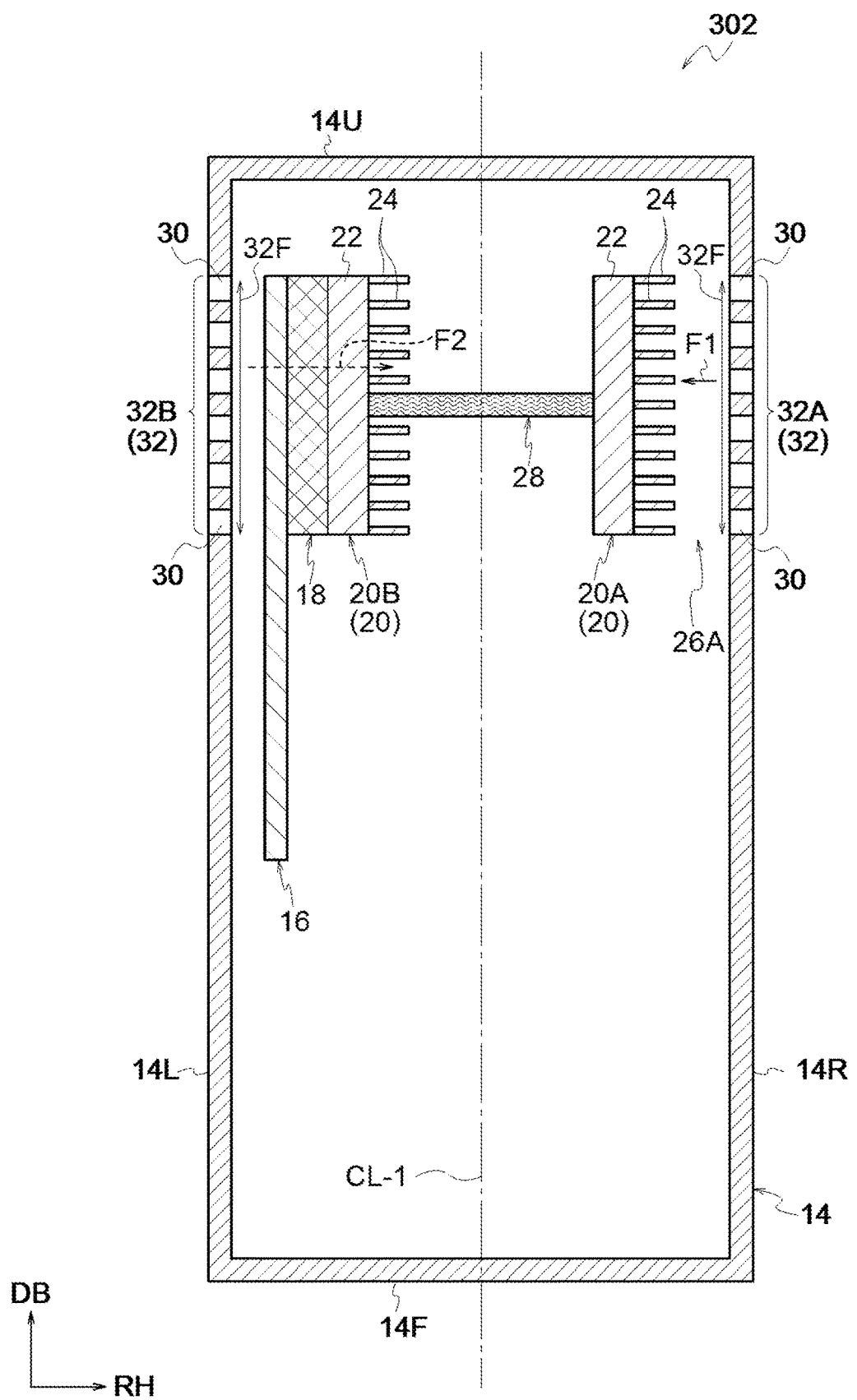
FIG. 6 is a cross-sectional view taken along the line VI-VI in FIG. 5 and illustrating the electronic apparatus according to the third embodiment.

As illustrated in FIGS. 5 and 6, an electronic apparatus 302 according to the third embodiment includes the substrate 16 arranged in parallel with the left surface 14L and in a position nearer the left surface 14L than the center line CL-1. The heating component 18 is mounted on the surface of the substrate 16 that faces the center line CL-1 of the housing 14. The heat sink 20B is arranged in contact with the surface of the heating component 18 opposite to the substrate 16, that is, the surface facing the center line CL-1 of the housing 14. The plurality of fins 24 in the heat sink 20B extend from the base plate 22 toward the center line CL-1 of the housing 14.

As described above, in this structure, in which the substrate 16 is arranged in parallel with the side surface of the housing 14, because the air intake region 32 is arranged close to the corresponding heat sink 20, the air may be easily led from the outside to the inside of the housing 14. The efficiency of cooling the heating component 18 is higher than that in the structure in which the air inlets 30 are in positions distant from the heat sink 20.

The arrangement in which the substrate 16 is in the vicinity of the left surface 14L may reduce a useless space inside the housing 14 and enhance the utilization efficiency of space inside the housing 14.

In the third embodiment, the fins 24 in the heat sink 20B extend toward the center line CL-1 of the housing 14. In this structure, the air flowing into the housing 14 through the air inlets 30 in the corresponding air intake region 32B comes into contact with the fins 24 as indicated by the arrow F2, and heat may be efficiently dissipated from the heat sink 20B.

Next, a fourth embodiment is described. In the fourth embodiment, substantially the same elements, members, and the like as in any one of the first to third embodiments are denoted by the same reference numerals and are not described.

Figure 7:
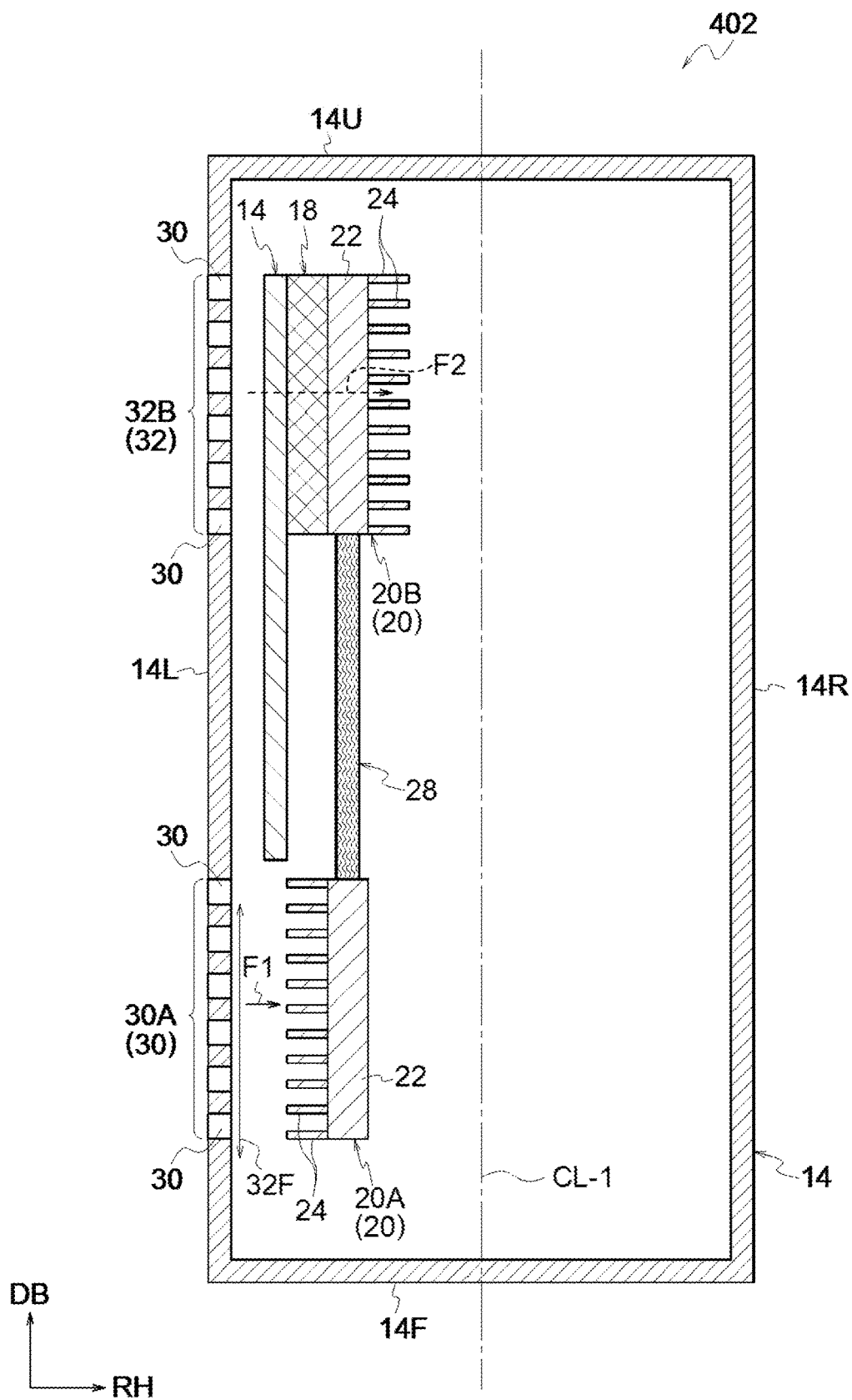
FIG. 7 is a horizontal sectional view that illustrates an electronic apparatus according to a fourth embodiment.

As illustrated in FIG. 7, an electronic apparatus 402 according to the fourth embodiment includes the heat sinks 20A and 20B both arranged on the left surface 14L side with respect to the center line CL-1 of the housing 14. When the housing 14 is seen in plan view, the substrate 16 is not positioned between the heat sink 20A and left surface 14L, and the fins 24 in the heat sink 20A extend from the base plate 22 toward the left surface 14L.

The air intake region 32A for the heat sink 20A is positioned in the left surface 14L of the housing 14.

As described above, in the structure in which the plurality of heat sinks 20 are in positions near the single side surface of the housing 14, the air intake regions 32 for the respective heat sinks 20 are positioned in the side surface near the heat sinks 20. Thus, the air flowing into the housing 14 through the air inlets 30 in the air intake regions 32 comes into contact with the heat sinks 20, and heat may be efficiently dissipated from the heat sinks 20.

The fins 24 in the heat sink 20A extend toward the side surface (left surface 14L) of the housing 14. When the housing 14 is seen in plan view, no member is present between the air intake region 32A and the fins 24 in the heat sink 20A. Accordingly, the air flowing into the housing 14 through the air inlets 30 in the air intake region 32A may be efficiently brought into contact with the fins 24 in the heat sink 20A.

Next, a fifth embodiment is described. In the fifth embodiment, substantially the same elements, members, and the like as in any one of the first to fourth embodiments are denoted by the same reference numerals and are not described.

Figure 8:
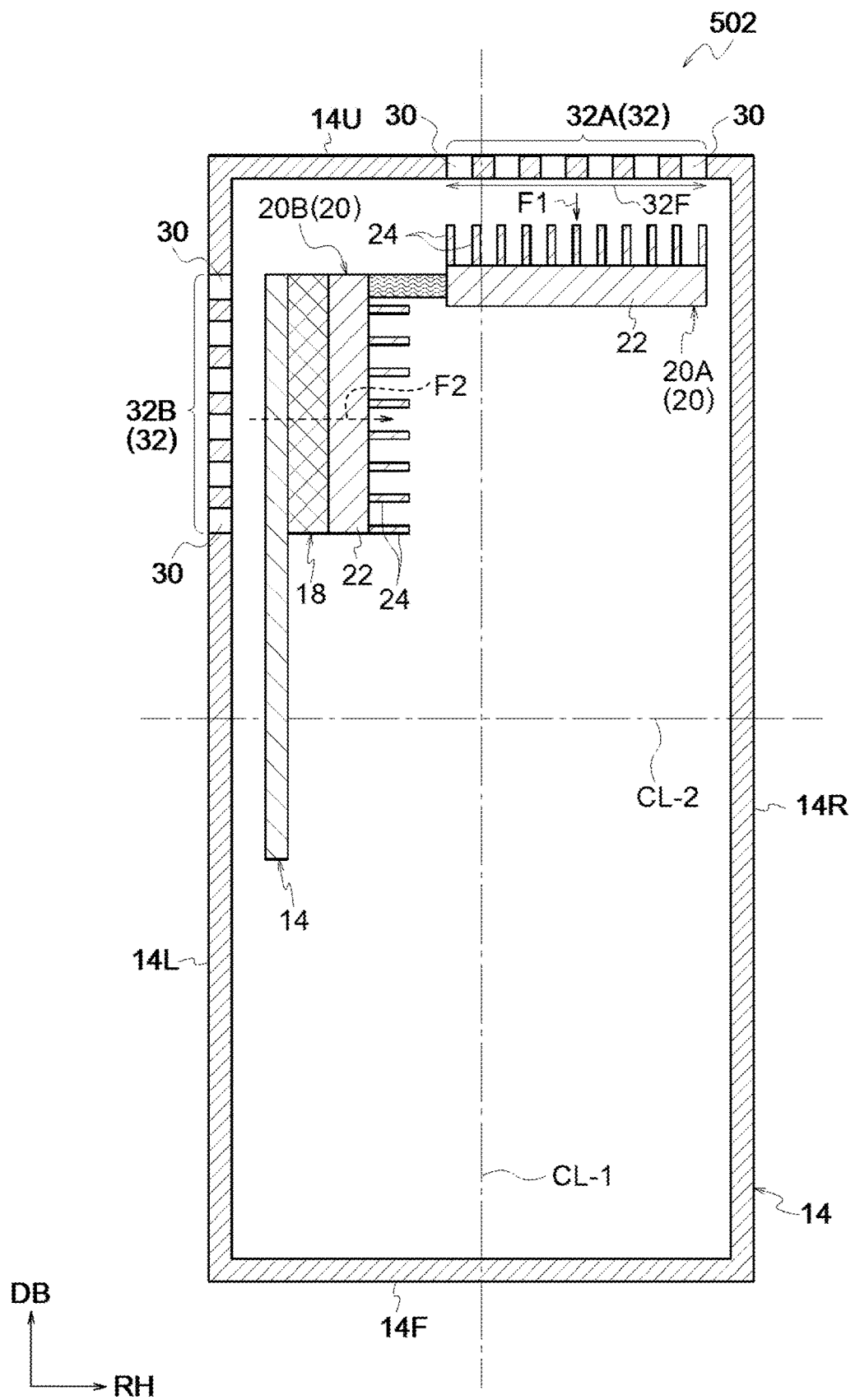
FIG. 8 is a horizontal sectional view that illustrates an electronic apparatus according to a fifth embodiment.

As illustrated in FIG. 8, an electronic apparatus 502 according to the fifth embodiment includes the heat sink 20A arranged near the back surface 14U of the housing 14. The air intake region 32A for the heat sink 20A is positioned in the back surface 14U of the housing 14. That is, the heat sink 20A and air intake region 32A are arranged on the same side with respect to a center line CL-2 of the housing 14 in the depth direction.

As described above, in the structure in which part of the plurality of heat sinks 20 is in a position near a surface that is not the side surfaces of the housing 14, the air intake regions 32 for the respective heat sinks 20 are positioned in the surfaces near the heat sinks 20. Thus, the air flowing into the housing 14 through the air inlets 30 in the corresponding air intake regions 32 comes into contact with the heat sinks 20, and heat may be efficiently dissipated from the heat sinks 20.

Next, a sixth embodiment is described. In the sixth embodiment, substantially the same elements, members, and the like as in any one of the first to fifth embodiments are denoted by the same reference numerals and are not described.

Figure 9:
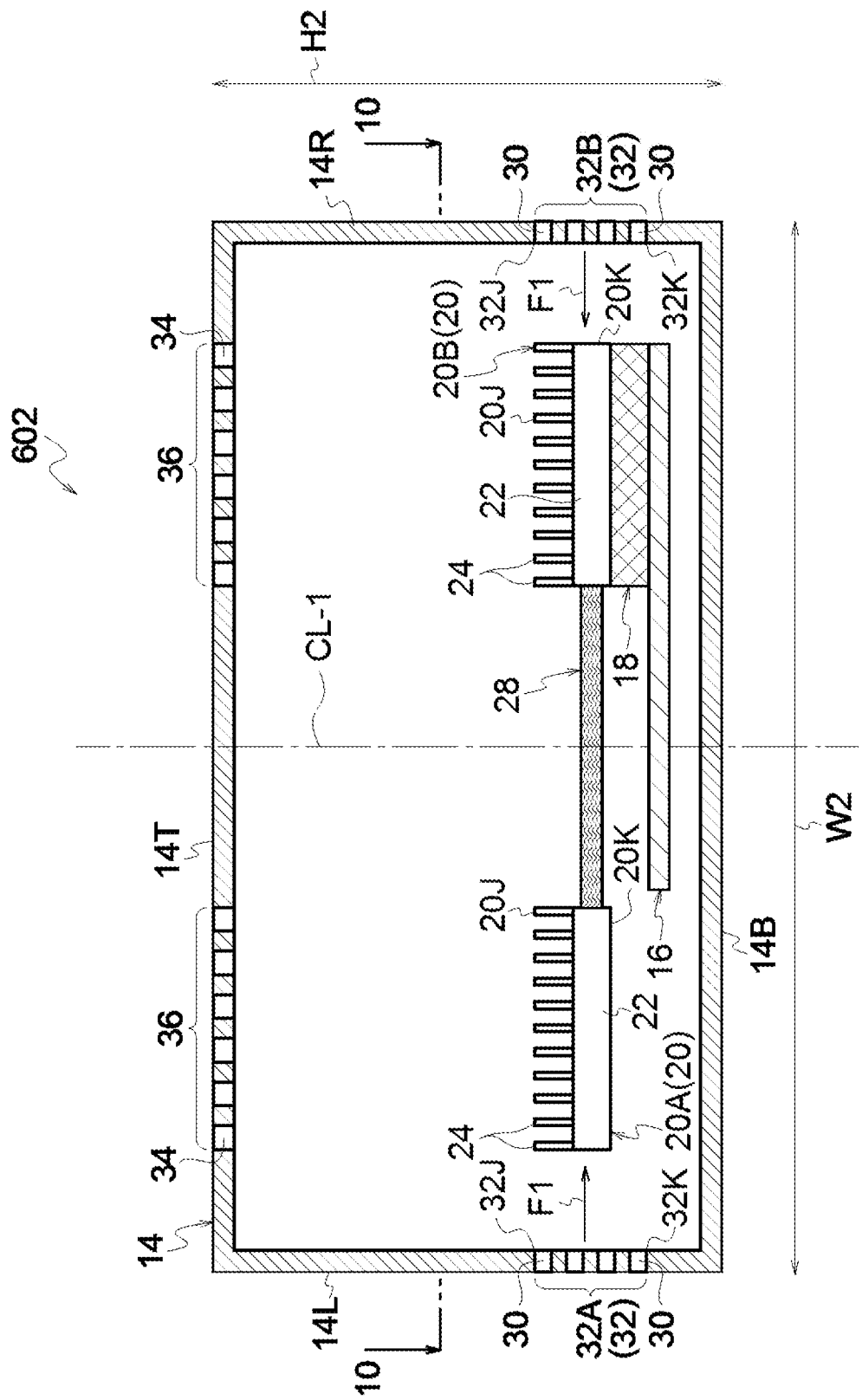
FIG. 9 is a longitudinal sectional view that illustrates an electronic apparatus according to a sixth embodiment.
Figure 10:
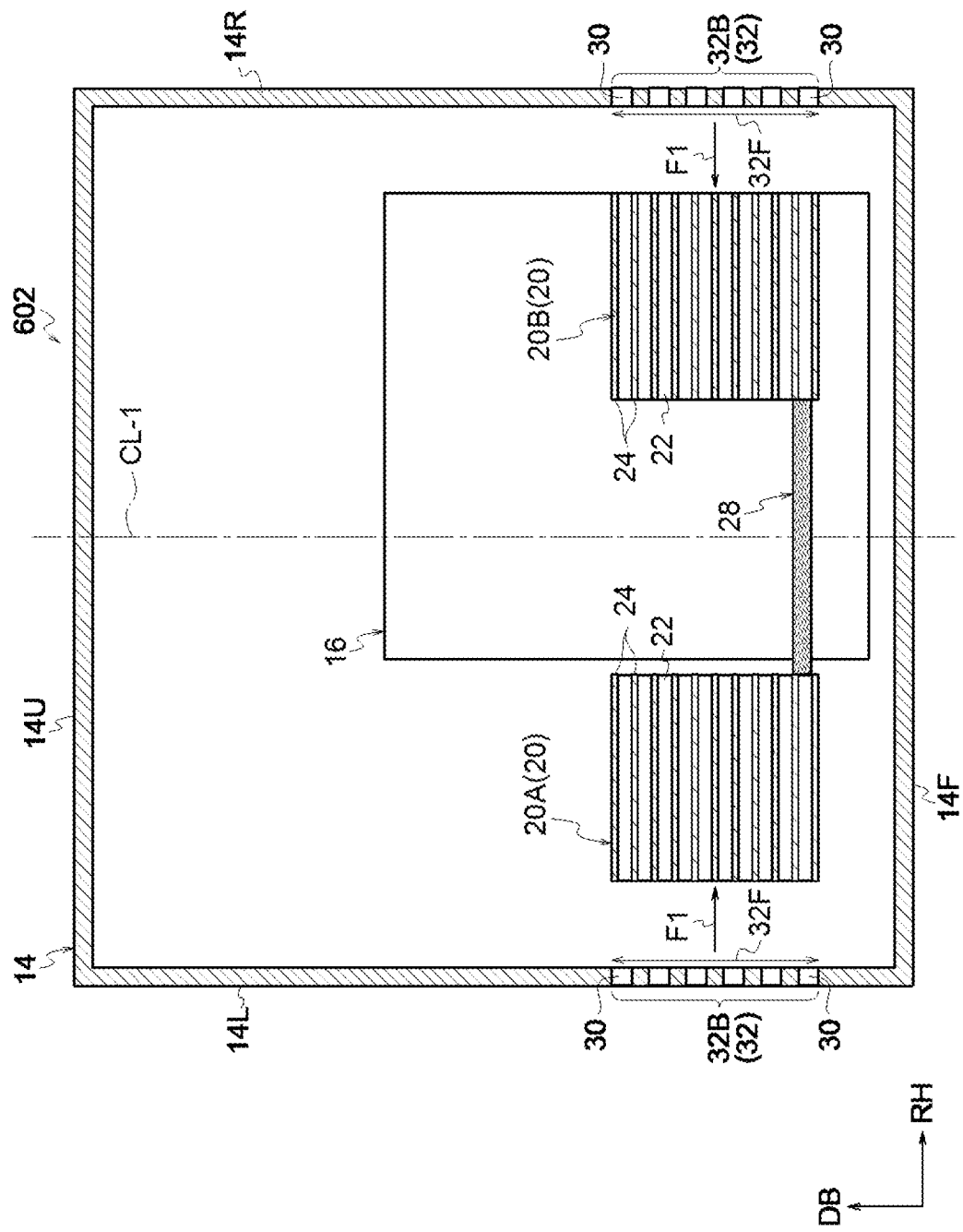
FIG. 10 is a cross-sectional view taken along the line X-X in FIG. 9 and illustrating the electronic apparatus according to the sixth embodiment.

As illustrated in FIGS. 9 and 10, an electronic apparatus 602 according to the sixth embodiment is an electronic apparatus in which the height H2 is shorter than the width W2 of the housing 14 and the housing 14 is horizontally oriented.

The electronic apparatus 602 according to the sixth embodiment includes the substrate 16 arranged in parallel with the bottom surface 14B of the housing 14. The heating component 18 is mounted on the substrate 16. In the illustrated example, the heating component 18 is on the right surface 14R side with reference to the center line CL-1.

The heat sink 20B is arranged in contact with the upper surface of the heating component 18 in a position on the right surface 14R side with respect to the center line CL-1. The heat sink 20A is in a position on the left surface 14L side with respect to the center line CL-1. The heat sink 20A and heat sink 20B are connected to each other with the heat transport member 28 disposed therebetween.

The air intake region 32A for the heat sink 20A is positioned in the right surface 14R of the housing 14. The air intake region 32B for the heat sink 20B is positioned in the left surface 14L of the housing 14.

As described above, the electronic apparatus 602, in which the housing 14 is horizontally oriented, includes the plurality of heat sinks 20 and the air intake regions 32 arranged close to the respective heat sinks 20. Thus, the air may be easily led from the outside to the inside of the housing 14. The efficiency of cooling the heating component 18 is higher than that in the structure in which the air inlets are in positions distant from the heat sinks 20.

The structure of each of the heat sinks 20 is not limited to specific ones. As illustrated in the above embodiments, the structure in which the plurality of fins 24 extend from the base plate 22 has a larger surface area and a higher dissipation effect, in comparison with a heat sink including no fins. The arrangement in which the heat sink 20 including the fins 24 is oriented such that the fins 24 extend from the base plate 22 toward the side surface of the housing 14 enables air flowing between the side surface and the base plate 22 to be brought into contact with the fins 24 and achieves effective heat dissipation.

In the embodiments, correspondences between the respect that the housing 14 is vertically or horizontally oriented and the orientation of the substrate 16 inside the housing 14 are not limited to specific ones. For example, the substrate 16 may be arranged in parallel with the bottom surface 14B inside the vertically oriented housing 14, or the substrate 16 may be arranged in parallel with the side surfaces (right surface 14R and left surface 14L) inside the horizontally oriented housing 14.

Figure 11A:
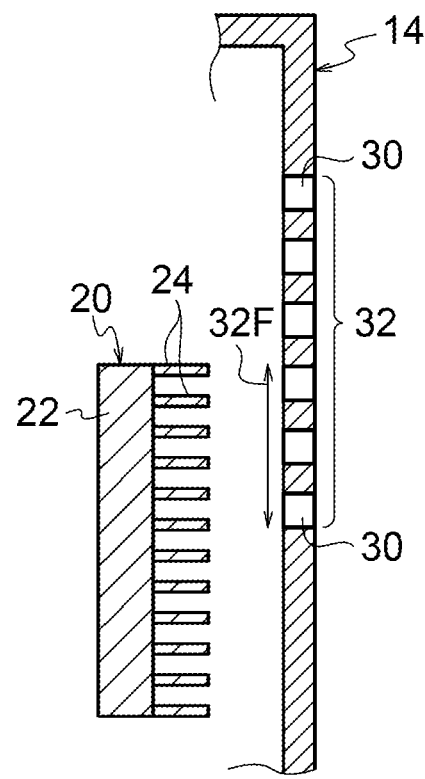
FIG. 11A is a cross-sectional view that illustrates a fragment of an electronic apparatus according to a variation.
Figure 11B:
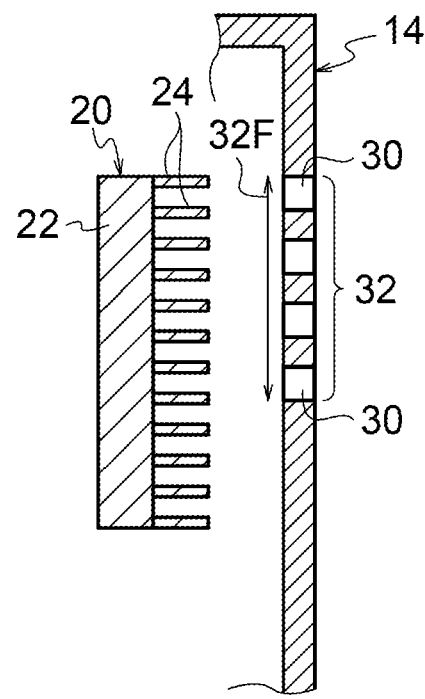
FIG. 11B is a cross-sectional view that illustrates a fragment of an electronic apparatus according to another variation.

In the above description, an example in which, the opposed region 32F, which is opposed to the heat sink 20, in the air intake region 32, is positioned over the full range of the air intake region 32 in the width direction is illustrated. The opposed region 32F may be positioned in part of the air intake region 32 in the width direction. For example, in a first variation illustrated in FIG. 11A, the opposed region 32F, which is opposed to the corresponding heat sink 20, is a part of the air intake region 32. As in a second variation illustrated in FIG. 11B, the structure in which the depth of the air intake region 32 is shorter than the depth of the corresponding heat sink 20 may be used.

Examples of the electronic apparatus in the above-described embodiments may include, but are not limited to, a desktop computer, workstation, and server.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
    a housing including two sides in each of which an air intake region is formed and a top surface in which an air exhaust region is formed, the two sides being parallel to each other;
    a heating component in the housing;
    a first heat sink coupled to the heating component and arranged along a first side of the two sides; and
    a second heat sink coupled to the heating component and arranged along a second side of the two sides,
    a distance between the first side and the first heat sink is less than a distance between the first side and the heating component, and
    a distance between the second side and the second heat sink is less than a distance between the second side and the heating component,
    heat is transferred from the heating component to both the first heat sink and the second heat sink.
2. The electronic apparatus according to claim 1, wherein the air intake region in the first side has a lower end portion positioned below a lower end portion of the first heat sink.
3. The electronic apparatus according to claim 1, wherein the air intake region in the first side has an upper end portion positioned between an upper end portion and a lower end portion of the first heat sink.
4. The electronic apparatus according to claim 1, wherein each of the first heat sink and the second heat sink includes
    a base plate, and
    a plurality of fins extending from the base plate toward each of the two sides.
5. The electronic apparatus according to claim 1, wherein at least one of the first heat sink and the second heat sink is coupled to the heating component via a heat pipe.
6. The electronic apparatus according to claim 1, wherein the heating component is positioned between the first heat sink and the second heat sink.
7. The electronic apparatus according to claim 1, wherein
    the heating component is coupled to the first heat sink without via a heat pipe coupling the first heat sink and the second heat sink,
    the heating component is coupled to the second heat sink via the heat pipe.
8. The electronic apparatus according to claim 1, wherein
    the heating component is coupled to the first heat sink via a heat pipe, and
    the heating component is coupled to the second heat sink via another heat pipe.
9. The electronic apparatus according to claim 1, wherein the heating component is positioned between the first heat sink and the first side.
10. The electronic apparatus according to claim 1, wherein each the air intake region does not include a fan.
11. The electronic apparatus according to claim 1, wherein each of the first heat sink and the second heat sink is not in contact with each of the two sides.

* * * * *